(12) United States Patent
Hussa

(10) Patent No.: US 7,223,681 B2
(45) Date of Patent: May 29, 2007

(54) INTERCONNECTION PATTERN DESIGN

(75) Inventor: Esa Hussa, Pirkkala (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/847,409

(22) Filed: May 17, 2004

(65) Prior Publication Data
US 2004/0251544 A1 Dec. 16, 2004

Related U.S. Application Data

(63) Continuation-in-part of application No. 10/439,489, filed on May 16, 2003, now abandoned.

(51) Int. Cl.
*H01L 21/44* (2006.01)
(52) U.S. Cl. .................... 438/612; 438/617
(58) Field of Classification Search ............... 257/786, 257/784; 438/617, 612
See application file for complete search history.

(56) References Cited

U.S. PATENT DOCUMENTS

| | | | |
|---|---|---|---|
| 5,557,502 A | 9/1996 | Banerjee et al. | 361/712 |
| 6,274,474 B1 | 8/2001 | Caletka et al. | 438/613 |
| 6,291,898 B1 | 9/2001 | Yeh et al. | 257/786 |
| 6,444,563 B1 | 9/2002 | Potter et al. | 438/615 |
| 6,459,161 B1 * | 10/2002 | Hirata et al. | 257/786 |
| 6,630,737 B2 * | 10/2003 | Zhao et al. | 257/738 |
| 6,650,014 B2 * | 11/2003 | Kariyazaki | 257/737 |
| 6,734,544 B2 * | 5/2004 | Yan et al. | 257/690 |
| 2003/0155640 A1 | 8/2003 | Yan et al. | 257/690 |

FOREIGN PATENT DOCUMENTS

| | | |
|---|---|---|
| EP | 1 001 462 A2 | 5/2000 |
| EP | 1 001 462 A3 | 12/2000 |

* cited by examiner

*Primary Examiner*—Phat X. Cao
(74) *Attorney, Agent, or Firm*—Harrington & Smith, PC

(57) ABSTRACT

An interconnection pattern design, which has an improved reliability under mechanical shock and thermal cycling loads. A semiconductor component comprises a plurality of interconnections aligned into rows and columns to form an interconnection pattern, wherein the interconnections are aligned such that the pattern has substantially rounded or chamfered corners. The present invention provides an improved interconnection life and reliability of ball grid array packages and it is easily implemented.

11 Claims, 7 Drawing Sheets

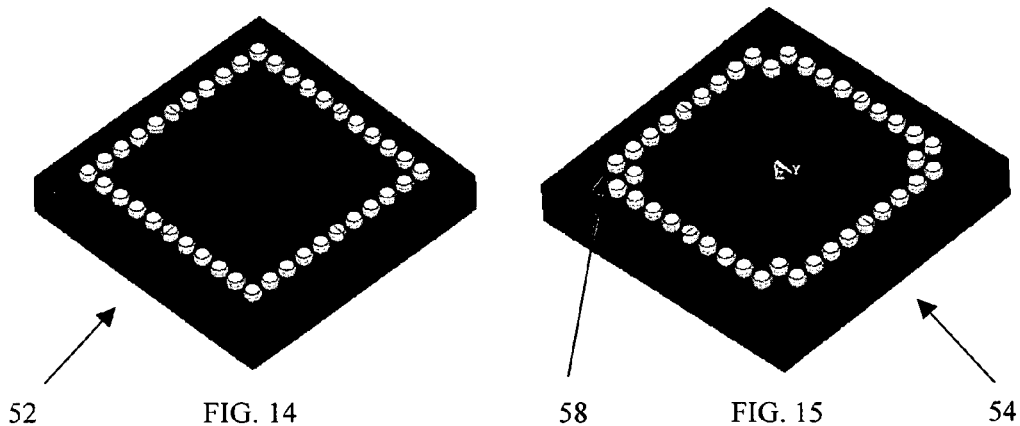
52  FIG. 14    58  FIG. 15    54
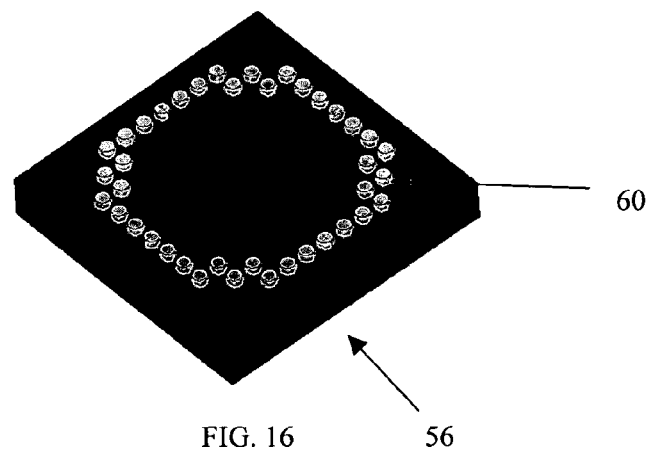
FIG. 16  56
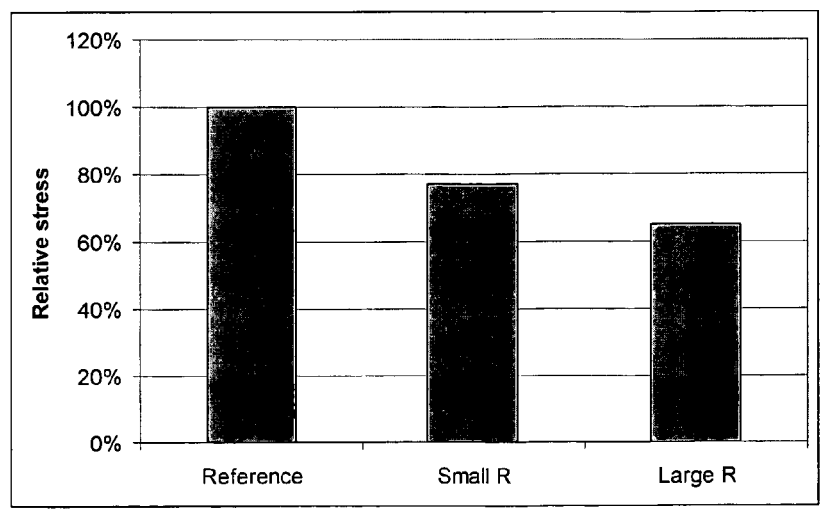
FIG. 17

INTERCONNECTION PATTERN DESIGN

CROSS-REFERENCE TO RELATED APPLICATIONS

This is a continuation-in-part patent application of U.S. application Ser. No. 10/439,489 filed May 16, 2003, abandoned, which is hereby incorporated by reference in its entirety.

FIELD OF THE INVENTION

The present invention relates generally to semiconductor devices, such as a cell phone or a computer. More particularly, the present invention relates to a method for extending life time and reliability of a semiconductor device and to reduce field failure rate (FFR) of the device. Furthermore, the present invention relates to an interconnection pattern design of a semiconductor component.

BACKGROUND OF THE INVENTION

Semiconductor components, such as ball grid array (BGA) and chip scale packaging (CSP) components, are one significant source of field failures in semiconductor devices, especially in portable and hand held devices such as cell phones. CSPs and BGAs will fail as a consequence of shock impact from mechanical shock and fatigue from thermal and bending cycling. CSPs and BGAs fail mainly due to failure in interconnection between a component and a printed wiring board (PWB) i.e. in an interconnection or PWB built up failure. Furthermore, high loading of interconnections may cause component internal failures, e.g. substrate or die cracking.

General examples of a prior art semiconductor components are illustrated in FIGS. 1a–1e. Specifically, FIGS. 1a–1e illustrate an integrated circuit component 20 that has interconnections 10 arranged in some two-dimensional layout in order to form an interconnection pattern. The interconnections 10 allow the component 20 to be electrically connected to other external devices, other peripherals, or other integrated circuits over conductive traces of a printed wiring board (PWB) or other substrate whereby larger electrical systems may be created (e.g. a computer, cell phone, television, etc.). In the prior art FIGS. 1a–1e, the interconnections 10 are aligned into rows and columns to form an interconnection pattern which has a rectangular shape with sharp corners. All interconnections 10 are of the same size but it is possible that some of the interconnections could have smaller or larger diameter.

One significant cause for failures is that loading is not distributed evenly between interconnections of the component. Typically corner interconnections meet the highest load and fail first.

Coefficient of thermal expansion (CTE) mismatch and temperature differences or fluctuations cause a component and a printed wiring board (PWB) to expand at different rate and magnitude. FIG. 2 illustrates in a simplified manner a cross sectional view of the ball grid array package 30 mounted on a printed wiring board 31 before deformation and FIG. 3 illustrates the same after deformation. It can be seen that the longer the distance from the component 32 center point is the higher deformation and stress an interconnection 33 have to undergo. Therefore, the corner solder joints 33' have to deform the most and are thus typically the most critical ones.

As a consequence of shock impact from mechanical shock, a printed wiring board (PWB) is deformed. Deformation is dependent on supporting structures and loading. Due to an acceleration, PWB is bent up- or downward in the area between screws. A component mounted on the PWB tends to follow said deformation. This leads to uneven loading of the interconnections and the corner solder joints of the component are loaded the most. FIGS. 4 and 5 illustrate a simplified example of the PWB 40 during a shock impact. During the shock impact the PWB 40 is bent downwards forming kind of a flat bowl. A component 41 attached to the PWB 40 can be imagined as a piece of glass, which is put into the bowl as in FIG. 4. A weight 42 is put on the glass, which represents the phenomena that glass (component) should be able to follow the deformation of bowl (PWB). A first place of breakage is dependent on the bottom area of the weight while in a component it is dependent on die size (rigid area). In any case, the most likely locations for failure are the corners of the glass. Another potential failure locations would be the corners of the weight.

When the glass is round as illustrated in FIG. 5, the glass is supported from the whole edge area. There, stress is even, and the most critical locations would probably be the corners of the weight i.e. the solder joints close to the die edge. Thus, rounded ballout would distribute loading more evenly between the interconnections and thus reduce stresses in critical solder joints, and, furthermore, improve reliability.

Therefore, a need exists in the industry for a method of designing an interconnection pattern whereby overall product reliability is greatly improved while the compactness of CSP and BGA devices is not substantially and adversely affected.

SUMMARY OF THE INVENTION

A primary object of the invention is to provide an interconnection pattern design, which has an improved reliability under mechanical shock and thermal cycling loads. The interconnection pattern in accordance with the present invention has substantially rounded or chamfered corners. Thus, reliability of the interconnections is improved by smaller loading and more even stress distribution between the connections.

A second primary object of the invention is to provide reduced component internal loadings, as the locally highly loaded joints don't transfer forces into the component. For example, a component may have some glass parts inside, which have relatively low strength. Then it's vital to have an interconnection pattern design, which does not increase stresses in glass unnecessarily.

In order to minimize the problems of the prior art and realize the other objects of this invention the invention is characterized by what is presented in the characterizing parts of the enclosed independent claims.

The embodiment examples and advantages mentioned in this text are in suitable parts applicable to all aspects of the invention, even if this is not always particularly mentioned.

According to the invention the rounded or chamfered corners can be achieved in different ways. One way to accomplish this is to simply leave out one or more electrically connecting interconnections from the corners or tips of an angular or rectangular interconnection pattern. Another way is to provide the interconnection pattern design with on or more weakened interconnections on the periphery of the interconnection pattern. Yet another way is to provide the interconnection pattern design with one or more electrically non-connecting interconnections on the periphery of the interconnection pattern.

Some embodiments of the invention are described in the dependent claims.

BRIEF DESCRIPTION OF THE DRAWINGS

The present invention is illustrated by way of an example and is not limited in the accompanying figures, in which alike references indicate similar elements, and in which:

FIGS. 14, 15, and 16 illustrate three examples of interconnection pattern designs, and FIG. 17 illustrates results to the three designs in FIGS. 14–16.

DESCRIPTION OF THE PREFERRED EMBODIMENTS

Figure 1A:
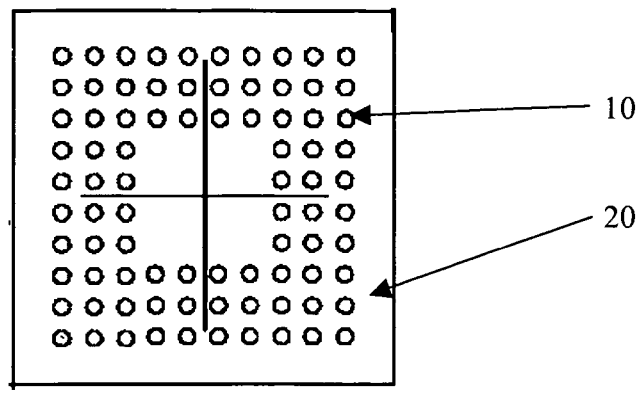
FIGS. 1a–1e illustrate a plan view of a prior art interconnection pattern.

Generally, the present invention provides a semiconductor component, a ball grid array (BGA) device and a method for designing a semiconductor component with solder joints having extended thermal fatigue life. Fatigue life is extended by designing an interconnection pattern to be substantially rounded or chamfered from the corners. Reliability of the interconnections is improved by smaller loading and more even stress distribution between the interconnections. Rounded or chamfered interconnection patterns are formed by designing a semiconductor component by aligning the interconnections such that the pattern formed by the interconnections has rounded or chamfered corners.

A semiconductor component according to the present invention can be achieved e.g. by modifying a prior art component by transferring multiple electrically connecting solder joints from the corners of an interconnection pattern to the sides of the pattern or to the center of the pattern or near to the center of the pattern. A semiconductor component according to the present invention can be achieved also by modifying a prior art component by adding multiple solder joints to the periphery of the pattern in order to design a pattern with rounded or chamfered pattern design. It is also self-evident that it is possible to design a novel semiconductor component having an interconnection pattern according to the present invention without amendment or modification of the prior art component.

A semiconductor component according to the present invention can also be achieved by adding a plurality of electrically non-connecting interconnections or weakened interconnections on the periphery of the interconnection pattern. Electrically non-connecting and weakened interconnections can also be arranged onto the corners or tips of the interconnection pattern.

By electrically non-connecting interconnections is meant that these joints are not used or needed for the proper functioning of the semiconductor component. By weakened interconnections is meant that these joints are made substantially weaker than those joints that are meant to remain electrically functional. Electrically non-connecting and weakened joints, especially when arranged on the periphery of an interconnection pattern or on the corners or tips of an interconnection pattern, can be arranged to receive the greatest stresses. The electrically non-connecting and weakened interconnections can be damaged without damaging the functioning of the semiconductor component or the apparatus it is a part of.

In some embodiments of the invention a substantially weakened interconnection means that compared to the electrically connecting interconnections at least 10%, 20%, 30%, 40% or 50% smaller force is needed in ball-off test or any comparable test for it to be broken.

Weakened interconnections can be made in different ways. Here are given some examples:

The solder joint is smaller

Smaller solder mask opening, if Solder Mask Defined i.e. SMD structure

Smaller solder pads, especially if Non-Solder Mask Defined i.e. NSMD structure

Oxidized or otherwise impure solder pads

Otherwise weakened InterMetalCompound (IMC) layer

Soldering material can be selected different i.e. weaker than the one used with the stronger joints Weakly attached solder pads either on the component side or the PWB side An interconnection structure, which facilitates forming of voids into solder joints.

The present invention may be useful in any type of packaging technology that includes interconnections such as, for example, solder balls or solder bumps, like, for example, BGA, CSP (chip scale package) and flip chip. The present invention may also be useful in different types of bump forming technology, such as, for example, the C4 (Controlled Collapse Chip Connection) bump process or the E3 (Extended Eutectic Evaporative) bump process. Furthermore, the present invention may also be utilized in other kinds of connection techniques between a semiconductor component and its base, like gluing. Thus it should be noted that the invention is not limited to used connection technique. The present invention will be further described with reference to FIGS. 6–17.

FIGS. 6–10 illustrate a plan view of an interconnection pattern in accordance with some alternative embodiments of the present invention. In FIGS. 6–17, the interconnections 10 are formed on a component 20. The interconnections are generally any number of conductive contact regions that are exposed at a surface of the component 20 in order to enable electrical contact to electrical circuitry formed on the component 20. The component 20 may be any device requiring solder balls and/or bumps to physically and electrically connect the component 20 to a printed wiring board or any other substrate. For example, the component 20 may be a substrate portion of a BGA package, or it may be a semiconductor material having metal pads for directly connecting to a PWB, such as in flip chip technology. The component 20 may be any kind of surface-mountable component, e.g. flip chip component or LGA, multi-chip module (MCM), a wafer scale integrated product, or the like integrated circuit devices. The interconnections 10 may be formed from a conductive metal such as aluminum or copper, and serve as terminals for external connections of the component 20. Note, that in the illustrated embodiments, the conductive contact regions are generally circular in shape. However, in other embodiments, the conductive contact regions may have other shapes, such as, for example, square or rectangular.

Figure 6:
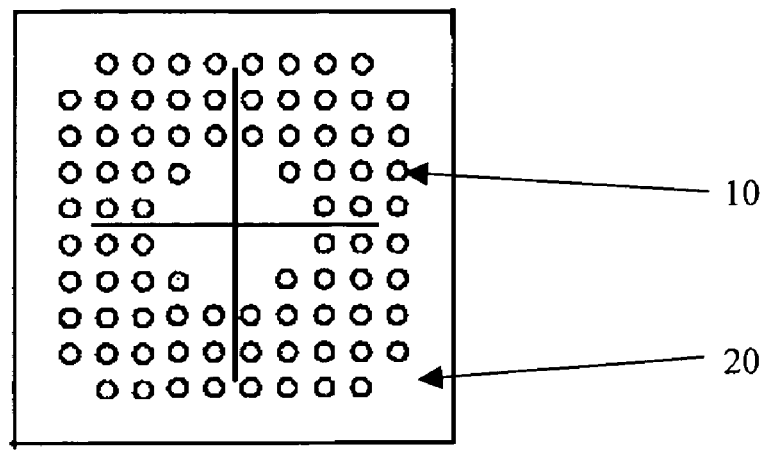
FIG. 6 illustrates a plan view of an interconnection pattern in accordance with the first preferred embodiment of the present invention.

In the first preferred embodiment of the present invention illustrated in FIG. 6, the interconnection pattern according to the prior art as illustrated in FIG. 1a is modified and designed according to the present invention by transferring one interconnection from each corner to the corners inside the inner circle of the joints. Thus, one electrically connecting joint at each outer corner is missing, but total number of the joints is equal to the prior art pattern as illustrated in FIG. 1a, the outermost rows and the outermost columns of the grid array having less electrically connecting joints than the second outermost rows and columns with the result of a pattern with chamfered corners. In other words, an outer loop comprising the joints in the periphery of the pattern has substantially chamfered corners. The interconnections illustrated in FIG. 6 and also in FIGS. 7–17 are solder joints. But as the invention is not limited to any specific connecting technique, they represent an example on one possible type of the used interconnection.

Figure 1B:
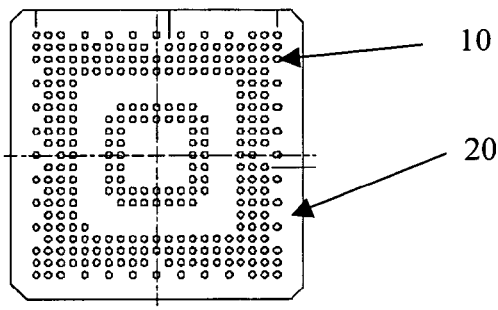
Figure 7:
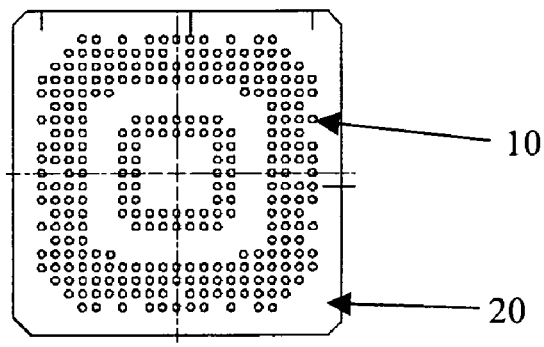
FIG. 7 illustrates a plan view of an interconnection pattern in accordance with the second preferred embodiment of the present invention.

In the second preferred embodiment of the present invention illustrated in FIG. 7, the interconnection pattern according to the prior art as illustrated in FIG. 1b is modified and designed according to the present invention by changing the position of six solder joints in each corner. Two solder joints are transferred to the corners inside the inner circle of the joints. Four solder joints are transferred to open spaces at the sides of the pattern. Thus, plurality of electrically connecting joints at each outer corner is missing but the total number of the joints is equal to the prior art pattern as illustrated in FIG. 1b, the outermost rows and the outermost columns of the grid array having less electrically connecting joints than the second outermost rows and columns and the second outermost columns of the grid array having equal amount or fewer electrically connecting joints than the third outermost rows and the third outermost columns of the grid with the result of a pattern with chamfered corners.

Figure 1C:
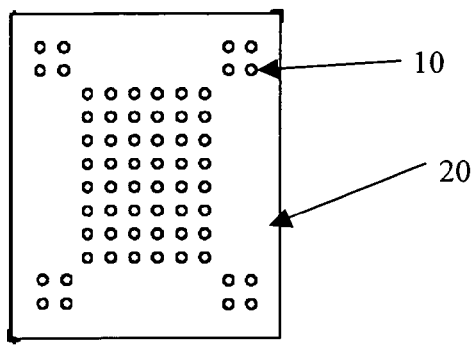
Figure 8:
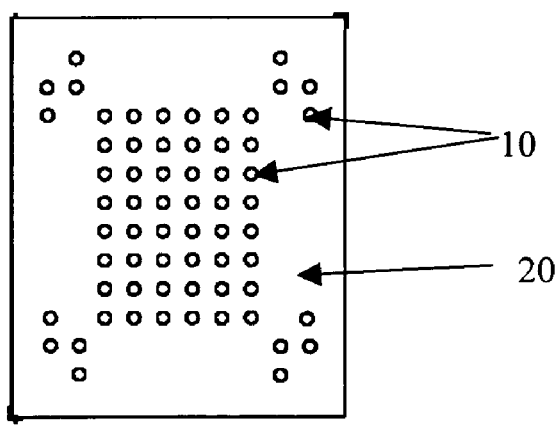
FIG. 8 illustrates a plan view of an interconnection pattern in accordance with the third preferred embodiment of the present invention.

In the third preferred embodiment of the present invention illustrated in FIG. 8, the interconnection pattern according to the prior art as illustrated in FIG. 1c is modified and designed according to the present invention by transferring one interconnection from each outermost corner to the side of the pattern.

Figure 1D:
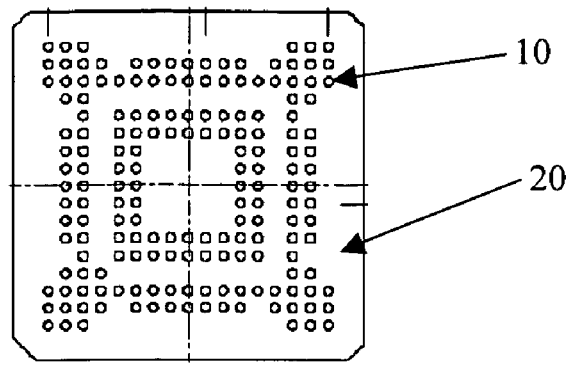
Figure 9:
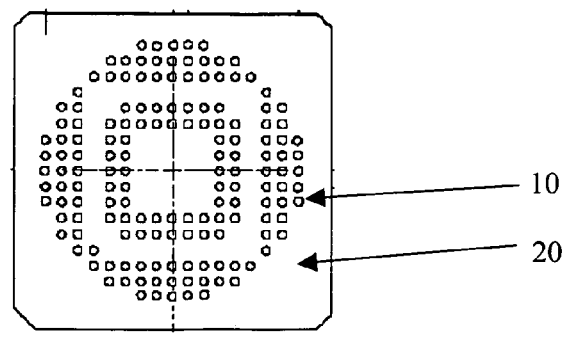
FIG. 9 illustrates a plan view of an interconnection pattern in accordance with the fourth preferred embodiment of the present invention.

In the fourth preferred embodiment of the present invention illustrated in FIG. 9, the interconnection pattern according to the prior art as illustrated in FIG. 1d is modified and designed according to the present invention by removing six support joints, i.e. not electrically connecting joints, from each corner and by transferring electrically connecting joints from corners to the sides of the original joint pattern. Thus, the joints of the interconnection pattern are arranged such that the pattern has rounded corners, close to round design. In some embodiments it is actually possible to design a pattern so that it has a round design.

Figure 1E:
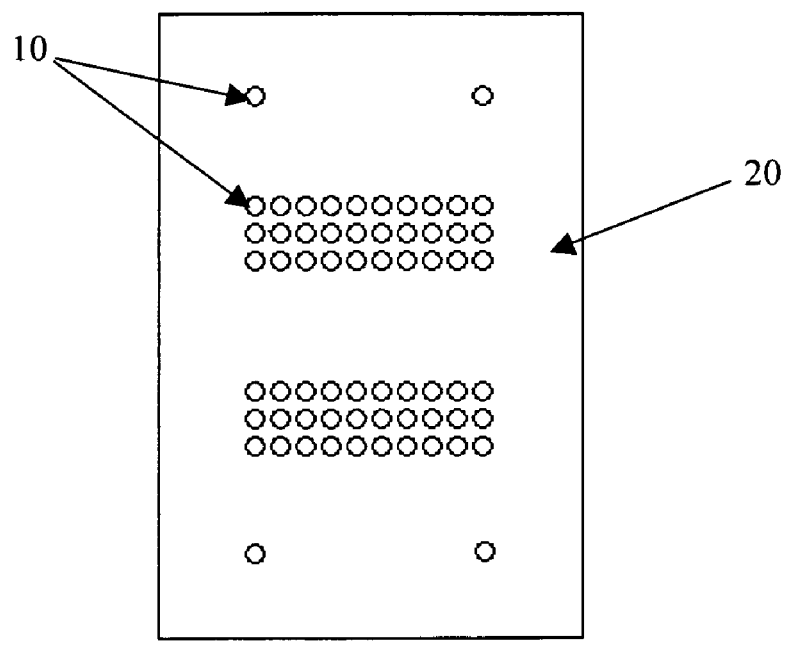
Figure 2:
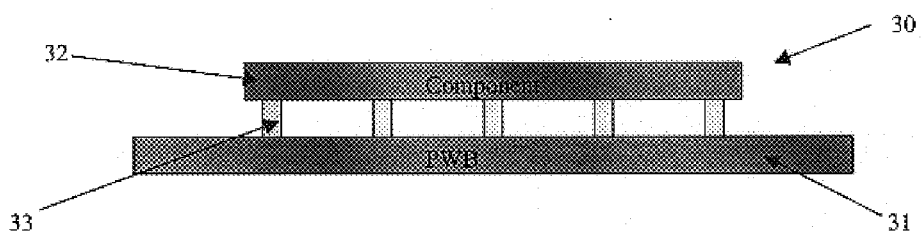
FIG. 2 illustrates a cross sectional view of the ball grid array package mounted on a printed wiring board.
Figure 3:
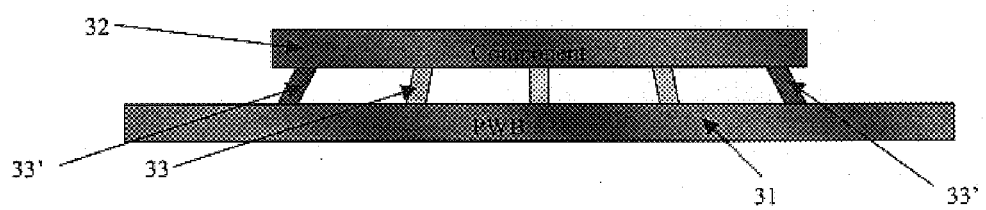
FIG. 3 illustrates a cross sectional view of the ball grid array package mounted on a printed wiring board after thermal deformation.
Figure 4:
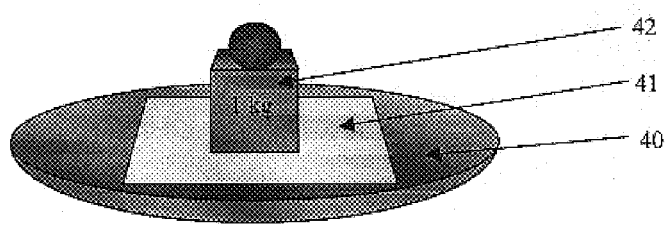
FIG. 4 illustrates a simplified example of the PWB during a shock impact.
Figure 5:
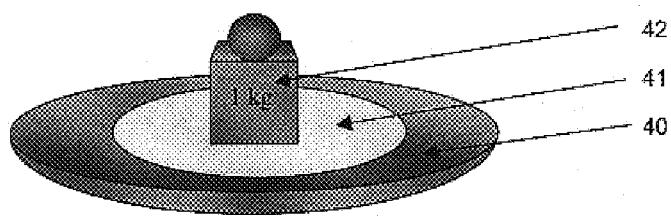
FIG. 5 illustrates a simplified example of the PWB comprising a component in accordance of the present invention during a shock impact.
Figure 10:
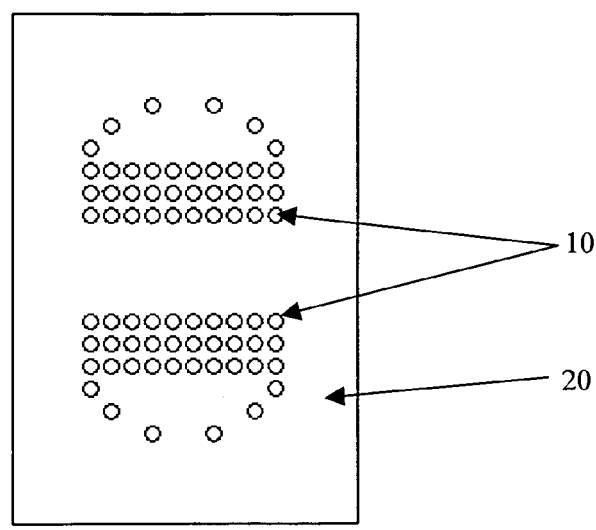
FIG. 10 illustrates a plan view of an interconnection pattern in accordance with the fifth preferred embodiment of the present invention.

In the fifth preferred embodiment of the present invention illustrated in FIG. 10, the interconnection pattern according to the prior art as illustrated in FIG. 1e is modified and designed according to the present invention by adding additional not electrically connecting solder joints which are arranged such that the joint pattern has rounded corners. In other words, additional joints are added so that the constructed outer loop of the pattern comprising the joints in the periphery of the pattern has substantially rounded corners. As illustrated in FIG. 1e, a die of the component extends significantly outside the interconnecting pattern. This has induced breakage of the die when handling the component, e.g. in manufacturing, and in mechanical shock situations. FIG. 1e illustrates support joints at the corners of the pattern without which the component is unstable in manufacturing line and it may tilt during processing, e.g. in a reflow oven. Tilting of the component may cause unsuccessful solder joint. However, placing of the additional support joints transmits deformation of PWB to the die of the component, whereupon the die will fracture. This problem is reduced with the joint pattern according to the present invention by adding additional support joints, which are placed such that the joint pattern has rounded corners.

Figure 12:
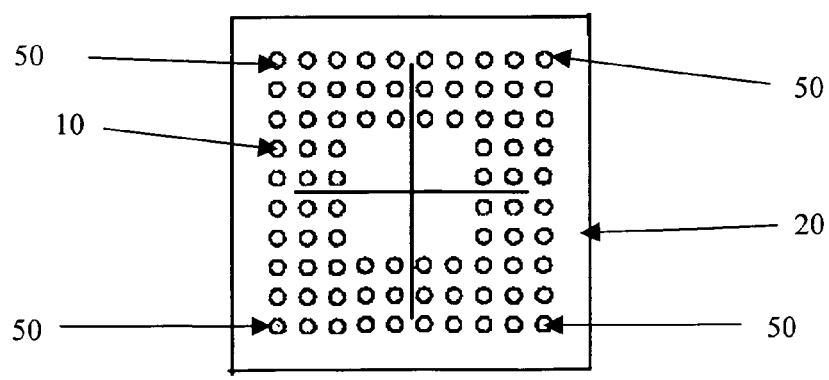
FIG. 12 illustrates a plan view of an interconnection pattern in accordance with the sixth preferred embodiment of the present invention.

FIG. 12 presents the sixth preferred embodiment of the invention. The component 20 has a plurality of interconnections 10 in a substantially rectangular interconnection pattern. On the corners of the pattern are situated electrically non-connecting and at the same time weakened interconnections 50. If these interconnections 50 are broken it will not effect the functioning of the component 20.

Figure 13:
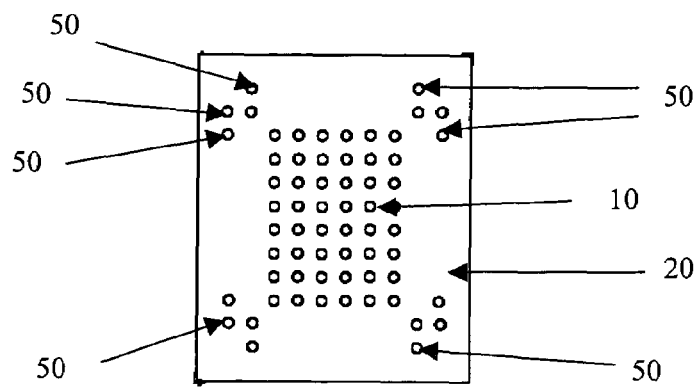
FIG. 13 illustrates a plan view of an interconnection pattern in accordance with the seventh preferred embodiment of the present invention.

FIG. 13 presents the seventh preferred embodiment of the invention. The component 20 has a plurality of interconnections 10 in a substantially rectangular interconnection pattern in its middle part. Near every corner of the component 20 there are situated four electrically non-connecting interconnections 50. The interconnections 50 are situated in such a way that the outer corners are rounded. If these interconnections 50 are broken it will not effect the functioning of the component 20. On or more of the interconnections 50 could as well be weakened interconnections as described above. It is also possible to arrange weakened interconnections on the corners of the rectangular interconnection pattern in the middle part of the pattern of FIG. 13.

Figure 11:
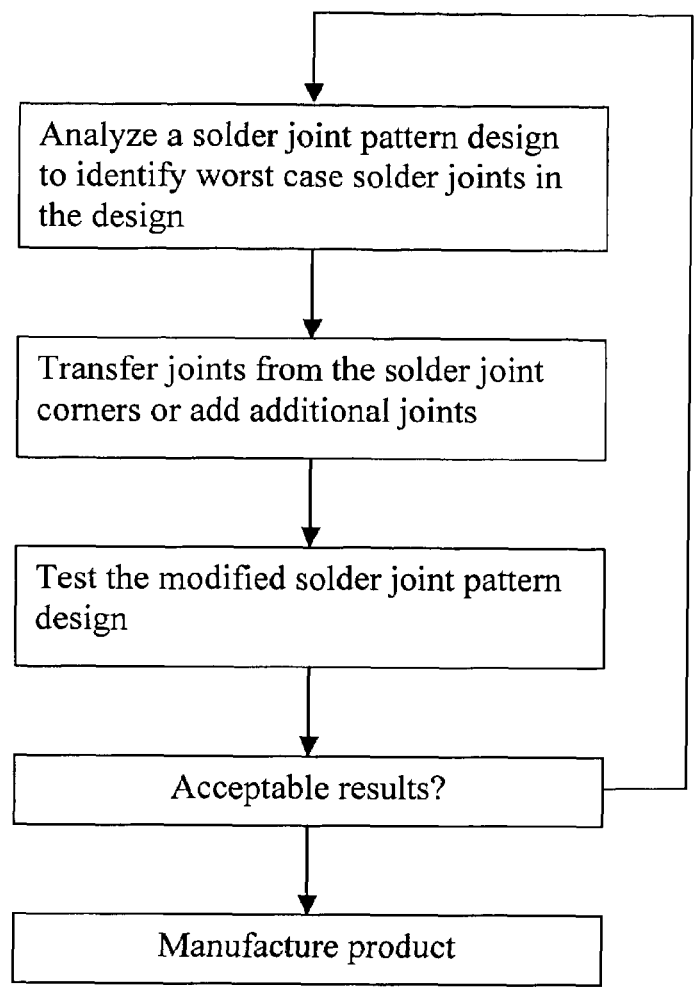
FIG. 11 illustrates a flow chart of a method for designing an interconnection pattern in accordance with one embodiment of the present invention.

FIG. 11 illustrates a flow chart of a method for designing an interconnection pattern in accordance with one embodiment of the present invention. At step 30, a prior art semiconductor BGA design is analyzed to determine which are the "worst case" solder joints, i.e., which interconnections of the design have the lowest reliability or which otherwise reduce the component or the component-PWB assembly reliability. At step 32, N interconnections as determined in step 30 are transferred from the interconnection corners to the sides of the pattern or to the center of the pattern or near to the center, where N is any size subset of the total number of interconnections on the corner. Alternatively at step 32, N solder joints are added at the vicinity of the "worst case" solder joints to create a pattern with chamfered or rounded corners. It is also possible to add weakened and electrically non-connecting solder joints as explained above. At step 34, the modified interconnection pattern is tested to determine component or the component-PWB assembly reliability. In the illustrated embodiment, the design is modeled using finite element method (FEM) analysis. If the reliability is improved by an acceptable amount, then the product can be accepted to manufacturing as in step 36. However, if the reliability has not been improved by the required amount, then steps 30 through 34 are repeated until the required reliability is demonstrated. This method can be used to design for example embodiments of the inventions as illustrated in FIGS. 6–13. E.g. in FIG. 13 this method could be used to calculate that all the connections marked with reference number 50 should be made as weakened and electrically non-connecting interconnections.

FIG. 14 presents a component 52 with a simple rectangular interconnection pattern design of the prior art. FIG. 15 presents a component 54, which has been modified from component 52 by removing on every corner of the design the one interconnection nearest the corner. The removed interconnection has been arranged just inside the new chamfered corner 58 of the design. FIG. 16 presents a component 56, which has been modified further from component 54 by removing on every corner of the design the two interconnections nearest the chamfered corner 58. The removed interconnections have been arranged just inside the new more chamfered corner 60 of the design.

FIG. 17 presents results obtained from a drop simulation on the three components of FIGS. 14–16. On the vertical axle is shown the maximum stress of the solder matrix. The stress is presented as percents of the stress on the corner of the rectangular design of component 52, called "Reference". The component 54 with just a little chamfered corners 58 is called "Small R" and the component 56 with most chamfered corners 60 is called "Large R". The results clearly show how the physical stress on solder matrix declines with appropriately rounded corners.

In one embodiment of the invention rounded or chamfered corners means that interconnection pattern is formed as a ball grid array in which one and preferably at least two joints at each corner of the array are missing. In some embodiments electrically connecting joints are missing, but substantially weakened connections are arranged on the corner. In further embodiments of the invention the interconnection pattern is formed as a ball grid array in which at least three, four, five, six or even more joints at each corner of the array are missing.

In one embodiment of the invention rounded or chamfered corners means that when drawing an envelope around an interconnection pattern along the joints on the periphery of the pattern, the line of the envelope forms only obtuse angles. I.e. rounded or chamfered corners in this embodiment are always less than 90 degrees. In further embodiments these angles are less than 80 degrees, less than 70 degrees, less than 60 degrees, less than 50 degrees, less than 40 degrees, less than 30 degrees or even less than 20 degrees. E.g. in the embodiment of FIG. 16 the number of corners is 8 and they are all of similar sharpness. Thus the corners of the envelope around the periphery of the pattern of FIG. 16 form angles of 45 degrees.

The present invention provides an improved interconnection life and reliability of ball grid array packages and it is easily implemented.

While the invention has been described in the context of preferred embodiments, which are not in order of superiority, it will be apparent to those skilled in the art that the present invention may be modified in numerous ways and may assume many embodiments other than that specifically set out and described above. Accordingly, it is intended by the appended claims to cover all modifications of the invention, which fall within the true scope of the invention.

The invention claimed is:

1. A method for designing a semiconductor component comprising an interconnection pattern formed as a ball grid, wherein the interconnections are designed to align such that the pattern has substantially rounded or chamfered corners, wherein the interconnection pattern is designed to comprise a first plurality of interconnections, which first interconnections are electrically connecting, and a second plurality of interconnections, which second interconnections are electrically non-connecting, on the periphery of the interconnection pattern and/or forming one or more angular or rectangular corners of the interconnection pattern, wherein the second interconnections are relatively weaker than the first interconnections.

2. A method as claimed in claim 1, wherein joint pattern is designed to a form of a ball grid array in which at least two electrically connecting joints at each corner of the array are missing.

3. A method as claimed in claim 1, wherein the interconnection pattern is designed to a form of a ball grid in which at least the outermost rows and the outermost columns of the grid have fewer amount of electrically connecting joints than the second outermost rows and the second outermost columns of the grid, and in which the second outermost rows and the second outermost columns of the grid have fewer amount of electrically connecting joints than the third outermost rows and the third outermost columns of the grid.

4. A method as claimed in claim 1, wherein joint pattern is designed to a form of a ball grid array in which at least two joints at each corner of the array are missing.

5. A method as claimed in claim 1, wherein the interconnection pattern is designed to a form of a ball grid in which at least the outermost rows and the outermost columns of the grid have fewer amount of joints than the second outermost rows and the second outermost columns of the grid, and in which the second outermost rows and the second outermost columns of the grid have fewer amount of joints than the third outermost rows and the third outermost columns of the grid.

6. A method as claimed in claim 1 wherein a plurality of bonding joints is located about the periphery of the component in an array arrangement in which at least joints of the outermost loop of the array are positioned such that the loop has substantially rounded or chamfered corners.

7. A method as claimed in claim 1, wherein the joint pattern is designed to comprise a plurality of additional non electrically connecting joints forming at least a part of the substantially rounded or chamfered corners of the pattern.

8. A method as claimed in claim 1, wherein the joint pattern is designed to comprise a plurality of electrically non-connecting interconnections on the periphery of the interconnection pattern.

9. A method as claimed in claim 1, wherein the joint pattern is designed to comprise a plurality of electrically non-connecting interconnections forming one or more angular or rectangular corners of the interconnection pattern.

10. A method for designing a semiconductor component comprising an interconnection pattern formed as a ball grid, wherein the interconnections are designed to align such that the pattern has substantially rounded or chamfered corners, wherein the interconnection pattern is designed to comprise a plurality of first interconnections, which first interconnections are electrically connecting, and a plurality of second interconnections, which second interconnections are electrically non-connecting, wherein the second interconnections are on a periphery of the interconnection pattern, and wherein the second interconnections are relatively weaker than the first interconnections.

11. A method for designing a semiconductor component comprising an interconnection pattern formed as a ball grid, wherein the interconnections are designed to align such that the pattern has substantially rounded or chamfered corners, wherein the interconnection pattern is designed to comprise a plurality of first interconnections, which first interconnections are electrically connecting, and a plurality of second interconnections, which second interconnections are electrically non-connecting, wherein the second interconnections are relatively weaker than the first interconnections, and wherein the second interconnections form one or more angular or rectangular corners of the interconnection pattern.

* * * * *